(12) United States Patent
Ho

(10) Patent No.: US 6,753,706 B2
(45) Date of Patent: Jun. 22, 2004

(54) DIRECT DIGITAL SYNTHESIZER

(75) Inventor: Hsiang-Te Ho, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/299,092

(22) Filed: Nov. 18, 2002

(65) Prior Publication Data

US 2003/0160637 A1 Aug. 28, 2003

(30) Foreign Application Priority Data

Feb. 18, 2002 (TW) ........................................ 91102714 A

(51) Int. Cl.$^7$ ................................................. H03M 1/66
(52) U.S. Cl. ........................ 327/105; 327/107; 341/144
(58) Field of Search ................................ 327/105, 106, 327/107; 341/144, 143, 145

(56) References Cited

U.S. PATENT DOCUMENTS 6,278,391 B1 * 8/2001 Walker ........................ 341/118
6,281,823 B1 * 8/2001 Gross, Jr. et al. ............ 341/144
6,400,298 B1 * 6/2002 Lee ............................. 341/144
6,424,283 B2 * 7/2002 Bugeja et al. ............... 341/145

FOREIGN PATENT DOCUMENTS

SU          1352615       *  5/1980

* cited by examiner

Primary Examiner—Dinh T. Le
(74) Attorney, Agent, or Firm—Volpe and Koenig, P.C.

(57) ABSTRACT

A direct digital synthesizer (DDS) for generating a waveform output according to a frequency input and a clock signal is provided. The direct digital synthesizer includes: a code generator for generating a digital code in response to the frequency input and the clock signal, a digital-analog converter (DAC) electrically connected with the code generator and comprising plural difference weighted coefficients for generating an analog waveform through an operation of the plural difference weighted coefficient and the digital code, and a filter electrically connected with the difference weighted digital-analog converter (DAC) for filtering the analog waveform to generate the waveform output. The provided direct digital synthesizer is able to generate all kinds of periodic waveforms with different phases without the conventional wave lookup ROM-table.

10 Claims, 5 Drawing Sheets

DIRECT DIGITAL SYNTHESIZER

FIELD OF THE INVENTION

The present invention is related to a frequency synthesizer, and more particularly, to a direct digital synthesizer (DDS).

BACKGROUND OF THE INVENTION

Direct digital synthesis (DDS) relates a technique of frequency synthesis, which generates different waveform output according to different frequencies and clocks for providing the signal source in the continued circuit. The samples of the generated signal are prepared in digital mode and these samples are converted into analog form by means of a digital-analog converter (DAC). Direct digital synthesis is a well circuit technique widely used in frequency synthesizer for wireless application, which covers wide frequency ranges, very fast frequency hopped, or arbitrary waveform generation.

Please refer to FIG. 1. FIG. 1 is a block diagram illustrating the conventional direct digital synthesizer according to the prior art. The conventional direct digital synthesizer includes a phase accumulator 10, a wave lookup ROM-table 11, a linear digital-analog converter (DAC) 12, and a low pass filter 13. The wave lookup ROM-table 11 is used for the storage of different waveform parameter.

Conventionally, the phase accumulator 10 combines with the wave lookup ROM-table 11 to generate a digital waveform according to the frequency and clock input. The digital waveform is delivered to the linear digital-analog converter (DAC) 12 to form an analog signal. Then, the linear DAC 12 output analog signal is passed through the low pass filter 13 to get a desired waveform output.

However, the conventional direct digital synthesizer usually uses the binary weighted or the linear weighted DAC, which needs to combine with the wave lookup ROM-table to generate the digital waveform. Moreover, the chip size is increased and the circuit design is more complex in the conventional art.

In order to overcome the drawbacks in the prior art, a direct digital synthesizer for generating a waveform output is provided, which is able to eliminate the conventional wave lookup ROM-table and simplify the circuit design.

SUMMARY OF THE INVENTION

The main purpose of the present invention is to provide a direct digital synthesizer, which is able to eliminate the conventional wave lookup ROM-table and simplify the circuit design for direct digital synthesis.

It is one object of the present invention to provide a direct digital synthesizer, which is able to generate all kinds of periodic waveforms with different phases.

It is another object of the present invention to provide a direct digital synthesizer with ROM-less structure, which is easier to be implemented and has a reduced chip size.

It is another object of the present invention to provide a direct digital synthesizer, which is suitably used in the waveform generator and the digital modulator of wireless product because of the low cost.

According to one aspect of the present invention, a direct digital synthesizer (DDS) for generating a waveform output according to a frequency input and a clock signal, comprises: a code generator for generating a digital code in response to the frequency input and the clock signal, a digital-analog converter (DAC) electrically connected with the code generator and comprising plural difference weighted coefficients for generating an analog waveform through an operation of the plural difference weighted coefficients and the digital code, and a filter electrically connected with the difference weighted digital-analog converter (DAC) for filtering the analog waveform to generate the waveform output.

In accordance with the present invention, the code generator is a thermometer code generator.

Preferably, the digital code is a thermometer code.

Preferably, the digital-analog converter (DAC) is a nonlinear difference weighted digital-analog converter.

Preferably, the digital-analog converter (DAC) is a current steer type DAC.

Preferably, the digital-analog converter (DAC) is a resistor type DAC.

Preferably, the filter is a low pass filter.

Preferably, the low pass filter is an anti-alias low pass filter.

Preferably, the waveform output is a periodic waveform.

Preferably, the waveform output is a sinusoidal waveform.

Preferably, the waveform output is an arbitrary waveform.

According to another aspect of the present invention, A method for a direct digital synthesizer (DDS) to generate a waveform output, comprises steps of: (a) defining plural difference weighted coefficients, (b) providing a frequency input and a clock signal, (c) generating a digital code in response to the frequency input and the clock signal, (d) generating an analog waveform in response to the digital code and the plural difference weighted coefficients, and (e) filtering the analog waveform for obtaining a desired waveform output.

The foregoing and other features and advantages of the present invention will be more clearly understood through the following descriptions with reference to the drawings, wherein:

DETAILED DESCRIPTION OF THE PREFERRED EMBODIMENT

Figure 1:
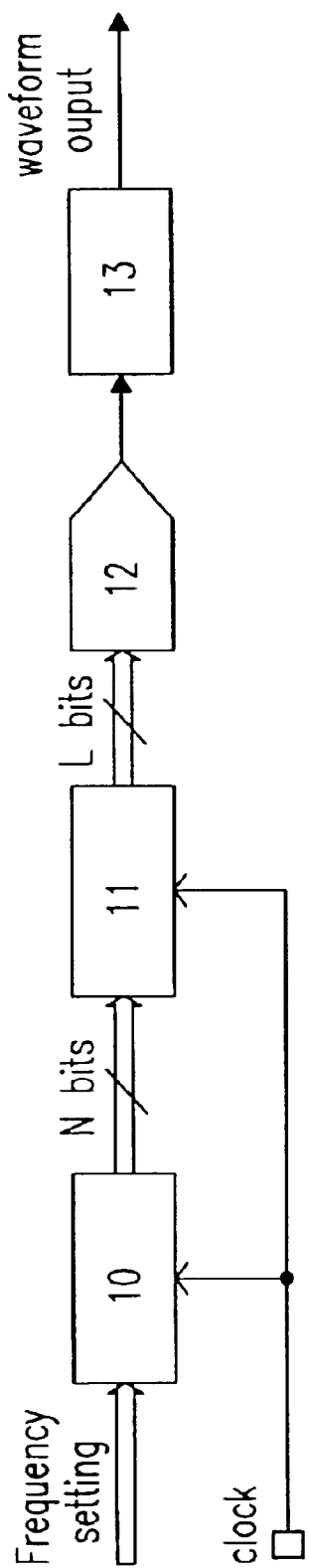
FIG. 1 is a block diagram illustrating the conventional direct digital synthesizer according to the prior art.
Figure 2:
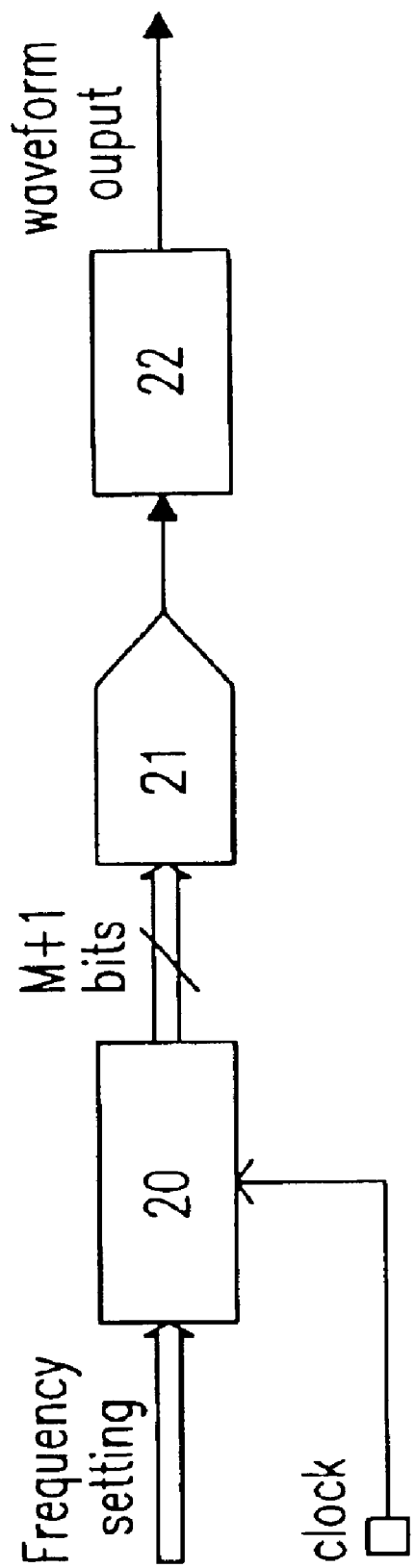
FIG. 2 is a block diagram illustrating the direct digital synthesizer according to a preferred embodiment of the present invention.

The present invention will now described more specifically with reference to the following embodiments. Please refer to FIG. 2. FIG. 2 is a block diagram illustrating the direct digital synthesizer according to a preferred embodiment of the present invention. The direct digital synthesizer provided in the present invention includes a thermometer code generator 20, a nonlinear DAC 21, and a anti-alias low pass filter 22. The direct digital synthesizer is able to generate a periodic waveform output according to the frequency input and the clock signal by a ROM-less direct digital synthesis.

The thermometer code generator 20 will generate M+1-bits digital thermometer code according the frequency input and the clock signal. The nonlinear DAC 21 is electrically connected with the thermometer code generator 20 and also has plural difference weighted coefficients. The nonlinear DAC 21 will then generate an analog waveform through an operation of the plural difference weighted coefficients and the thermometer digital code. The nonlinear DAC 21 here could be the current steer type DAC or the resistor type DAC. Afterwards, the analog waveform is delivered to the anti-alias low pass filter 22 for wave filtering. A desired waveform output will be generated according to the beginning frequency input and the clock signal.

Figure 3A:
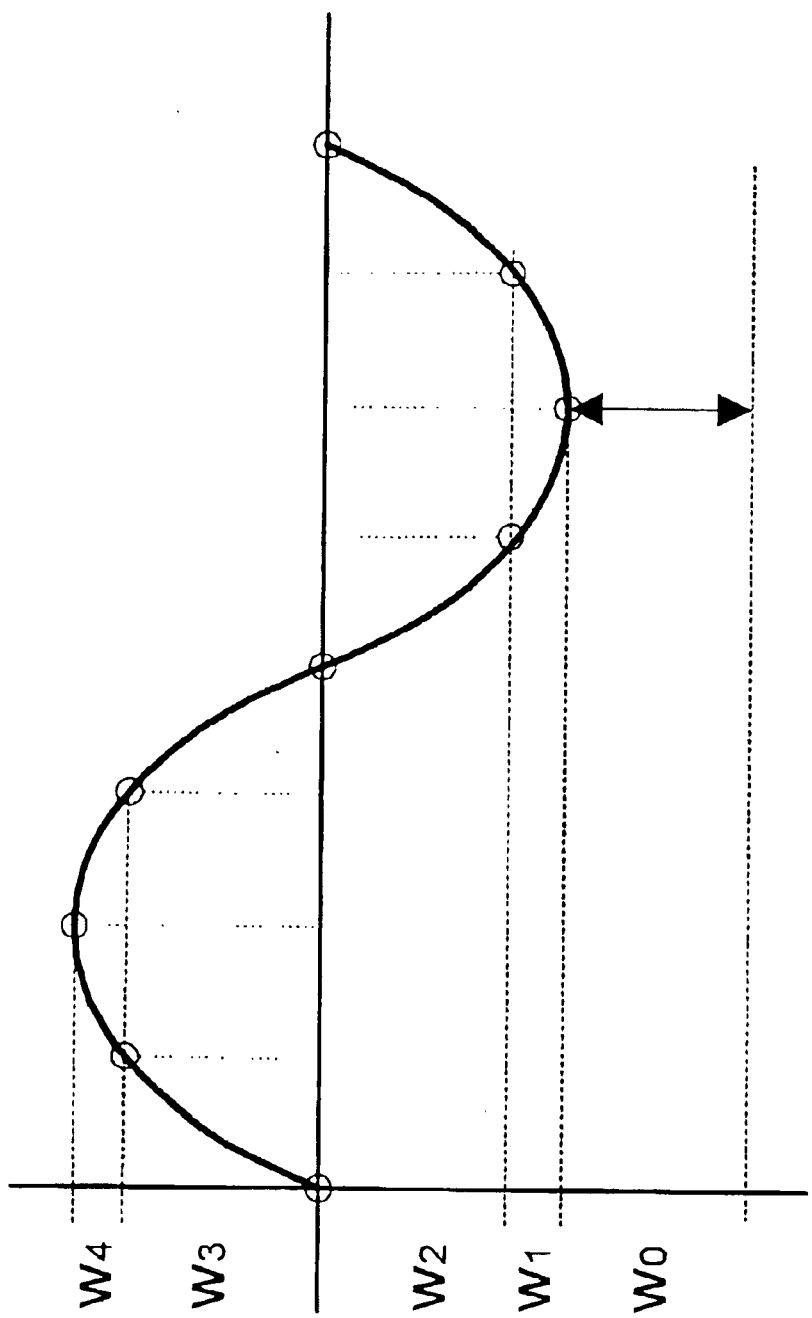
FIG. 3(a) is a diagram illustrating the sampling SIN waveform according to a preferred embodiment of the present invention.

Please refer to FIG. 3(a). FIG. 3(a) is a diagram illustrating the sampling SIN waveform according to a preferred embodiment of the present invention. The weighted coefficient $W_0$ in FIG. 3(a) is defined as the output DC-offset value. In fact, the difference weighted coefficient is the difference value of every sampled waveform as shown in FIG. 3(a). The difference weighted coefficient is obtained by the following formula. The periodic sinusoidal SIN waveform is described as a preferred embodiment in the present invention. The desired periodic sinusoidal SIN waveform is sampled at certain points and sampled waveform is represented as S[n]. The difference-SIN function D[n] is defined by the equation, D[n]=ABS(S[n+1]−S[n]). D[n] at certain points is obtained in table 1.

TABLE 1

A 4-bits difference-SIN waveform table

| Sample n | Phase (degree) | SIN function: S[n] | Difference-SIN D[n] = ABS(S[n + 1]-S[n]) | Weighted Coefficient |
|---|---|---|---|---|
| 1 | 0 | SIN(0) = 0 | 0.707 | w3 = 707 |
| 2 | 45 | SIN(π/4) = 0.707 | 0.293 | w4 = 293 |
| 3 | 90 | SINQ(π/2) = 1 | 0.293 | w4 = 293 |
| 4 | 135 | SIN(3π/4) = 0.707 | 0.707 | w3 = 707 |
| 5 | 180 | SIN(π) = 0 | 0.707 | w2 = 707 |
| 6 | 225 | SIN(5π/4) = −0.707 | 0.293 | w1 = 293 |
| 7 | 270 | SIN(3π/2) = −1 | 0.293 | w1 = 293 |
| 8 | 315 | SIN(7π/4) = −0.707 | 0.707 | w2 = 707 |
| 9 | 360 | SIN(2π) = 0 | | |

The plural difference weighted coefficient $W_i$ of the periodic waveform is finally obtained by converting the equivalent weighted value as shown in table 2.

TABLE 2

A 4-bits difference-SIN weighted coefficient

| Coefficient | Value |
|---|---|
| w0* | 0 |
| w1 | 293 |
| w2 | 707 |
| w3 | 707 |
| w4 | 293 |

*w0 is output DC offset coefficient

Figure 3B:
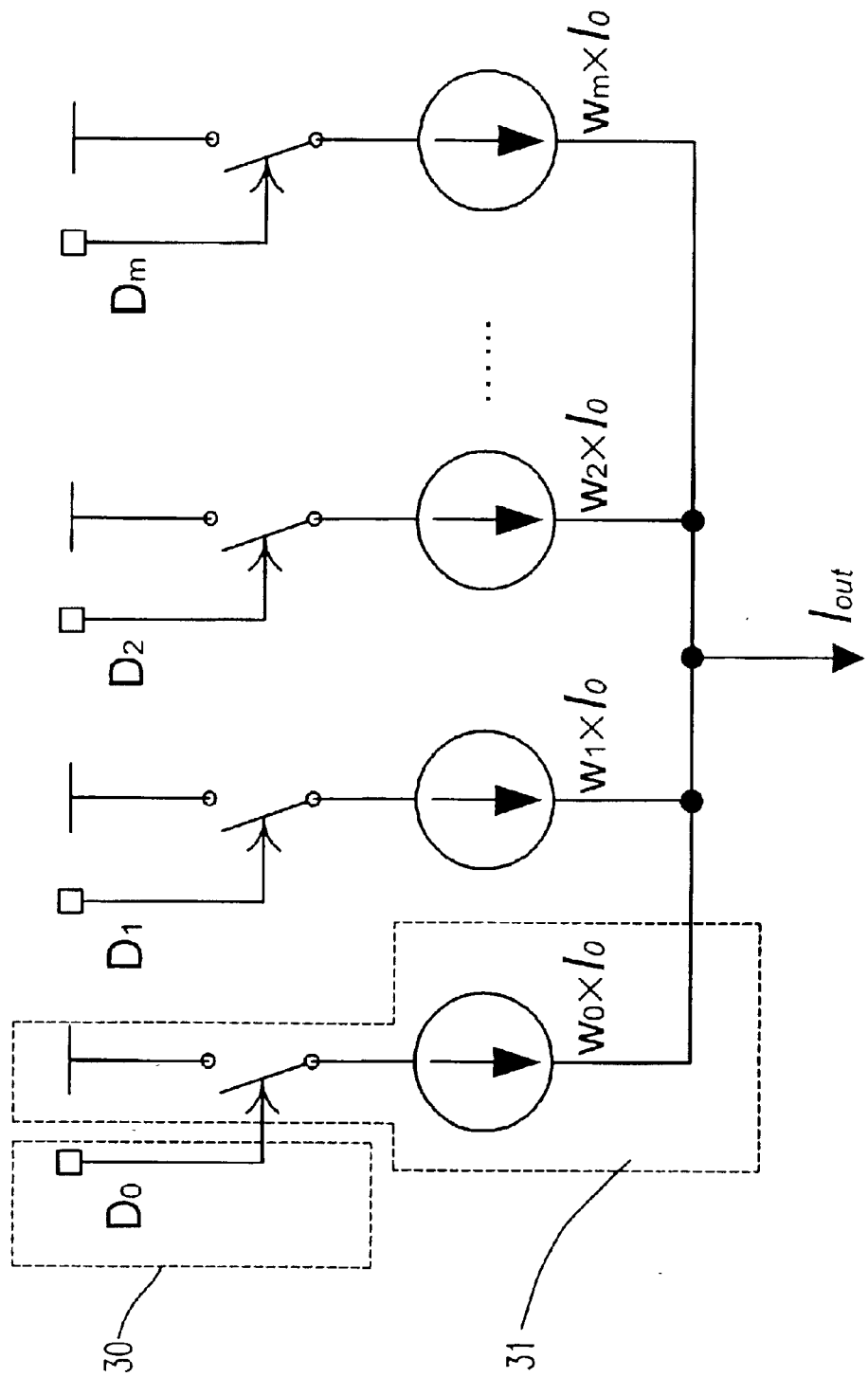
FIG. 3(b) is a block diagram illustrating the structure of the nonlinear difference weighted current type DAC according to a preferred embodiment of the present invention.
Figure 3C:
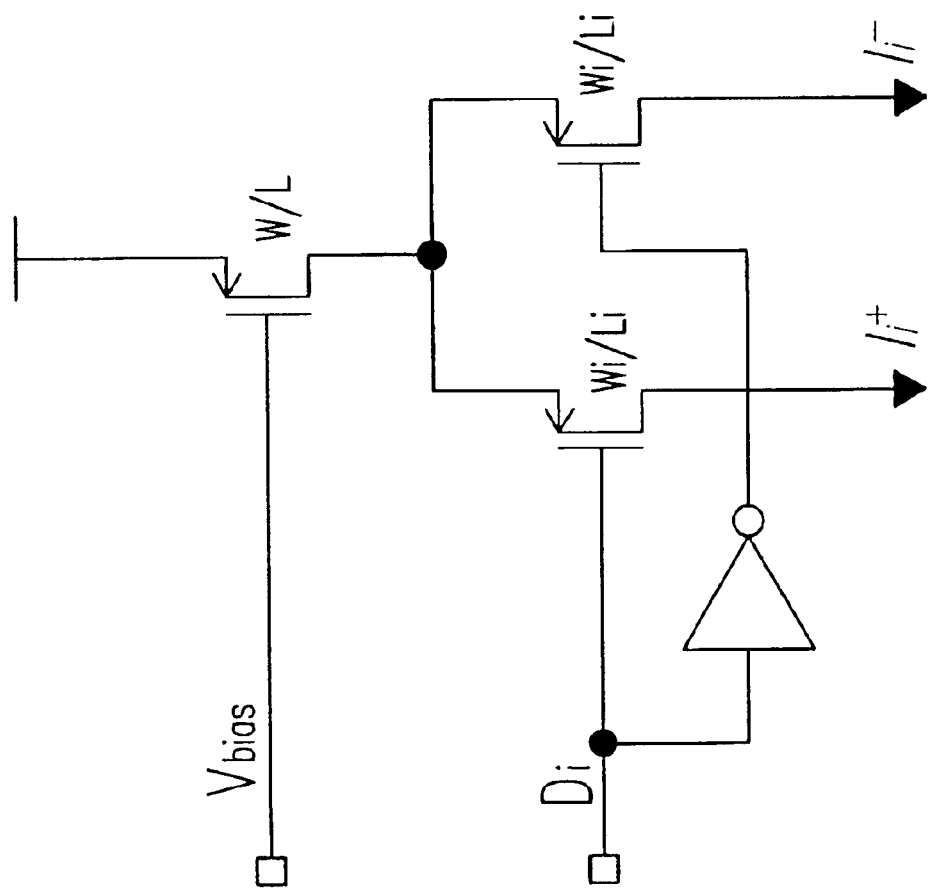
FIG. 3(c) is a diagram illustrating the typical switched current cell according to a preferred embodiment of the present invention.

Please refer to FIG. 3(c). FIG. 3(c) is a diagram illustrating the typical switched current cell according to a preferred embodiment of the present invention. The width/length (W/L) of MOS device is adjusted to satisfy the relationship of weighted coefficient. The difference weighted coefficient $W_i$ is respectively saved in the nonlinear difference weighted current type DAC. Therefore, the additional lookup ROM-table is not required for the storage of the desired waveform.

Please refer to FIG. 3(b). FIG. 3(b) is a block diagram illustrating the structure of the nonlinear difference weighted current type DAC according to a preferred embodiment of the present invention. The nonlinear difference weighted current type DAC includes plural difference weighted coefficients 30 and plural current switch 31. The difference weighted coefficient is combined with the thermometer code (as shown in table. 3) and the bias voltage $V_{bias}$ (or the reference $I_0$ of the power source) to generate an analog waveform by the nonlinear DAC 21.

TABLE 3

A SIN waveform generation by 4-bits thermometer code:

| Sample N | Phase (degree) | DAC thermometer code D0 | D1 | D2 | D3 | D4 | Output value of DAC | |
|---|---|---|---|---|---|---|---|---|
| 1 | 0 | 1 | 1 | 1 | 0 | 0 | (w0 + w1 + w2)*I0 | 1 |
| 2 | 45 | 1 | 1 | 1 | 1 | 0 | (w0 + w1 + w2 + w3)*I0 | 1.707 |
| 3 | 90 | 1 | 1 | 1 | 1 | 1 | (w0 + w1 + w2 + w3 + w4)*I0 | 2 |
| 4 | 135 | 1 | 1 | 1 | 1 | 0 | (w0 + w1 + w2 + w3)*I0 | 1.707 |
| 5 | 180 | 1 | 1 | 1 | 0 | 0 | (w0 + w1 + w2)*I0 | 1 |
| 6 | 225 | 1 | 1 | 0 | 0 | 0 | (w0 + w1)*I0 | 0.293 |
| 7 | 270 | 1 | 0 | 0 | 0 | 0 | (w0)*I0 | 0 |
| 8 | 315 | 1 | 1 | 0 | 0 | 0 | (w0 + w1)*I0 | 0.293 |
| 9 | 360 | 1 | 1 | 1 | 0 | 0 | (w0 + w1 + w2)*I0 | 1 |

In the end, the analog waveform is filtered by the anti-alias low pass filter 22 and the smooth sinusoidal SIN waveform output is generated. Similarly, the COS waveform as shown in table 4 is able to be obtained through the above procedure and circuit.

TABLE 4

A COS waveform generation by 4-bits weighted code:

| Sample no | Phase (degree) | DAC thermometer code D0 | D1 | D2 | D3 | D4 | Output value of DAC | |
|---|---|---|---|---|---|---|---|---|
| 1 | 0 | 1 | 1 | 1 | 1 | 1 | (w0 + w1 + w2 + w3 + w4))*I0 | 2 |
| 2 | 45 | 1 | 1 | 1 | 1 | 0 | (w0 + w1 + w2 + w3)*I0 | 1.707 |

TABLE 4-continued

A COS waveform generation by 4-bits weighted code:

| Sample no | Phase (degree) | \multicolumn{5}{c}{DAC thermometer code} | Output value of DAC | |
|---|---|---|---|---|---|---|---|---|
| | | D0 | D1 | D2 | D3 | D4 | | |
| 3 | 90  | 1 | 1 | 1 | 0 | 0 | (w0 + w1 + w2)*I0 | 1 |
| 4 | 135 | 1 | 1 | 0 | 0 | 0 | (w0 + w1)*I0 | 0.293 |
| 5 | 180 | 1 | 0 | 0 | 0 | 0 | (w0)*I0 | 0 |
| 6 | 225 | 1 | 1 | 0 | 0 | 0 | (w0 + w1)*I0 | 0.293 |
| 7 | 270 | 1 | 1 | 1 | 0 | 0 | (w0 + w1 + w2)*I0 | 1 |
| 8 | 315 | 1 | 1 | 1 | 1 | 0 | (w0 + w1 + w2 + w3)*I0 | 1.707 |
| 9 | 360 | 1 | 1 | 1 | 1 | 1 | (w0 + w1 + w2 + w3 + w4)*I0 | 2 |

The difference weighted coefficient is changed following the change of the desired waveform. Since the DAC is the current steer type, the width/length (W/L) of MOS device in the DAC current source is adjusted to satisfy relationship of weighted coefficient. When the DAC is a resistor type, the relative proportional resistance in the DAC will be adjusted to accomplish the required circuit.

From the above description, it is known that the present invention is able to generate all kinds of periodic waveforms with different phases without the conventional wave lookup ROM-table. The nonlinear DAC having plural difference weighted coefficients 's used in the present invention. The difference weighted coefficient produced by the value difference is able to decrease the relative value of the current (resistance), so that the relative error is reduced when the synthesizer is operated. In addition, the circuit design is simplified, and the chip size is reduced in the present invention. Therefore, the present invention is practical for the industrial development.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A direct digital synthesizer (DDS) for generating a waveform output according to a frequency input and a clock signal, comprising:

a thermometer code generator for generating a digital code in response to said frequency input and said clock signal;

a digital-analog converter (DAC) electrically connected with said thermometer code generator and comprising plural difference weighted coefficients for generating an analog waveform through an operation of said plural difference weighted coefficients and said digital code; and a filter electrically connected with said DAC for filtering said analog waveform to generate said waveform output.

2. The DDS according to claim 1, wherein said digital code is a thermometer code.

3. The DDS according to claim 1, wherein said DAC is a non-linear difference weighted DAC.

4. The DDS according to claim 1, wherein said DAC is a current steer type DAC.

5. The DDS according to claim 1, wherein said DAC is a resistor type DAC.

6. The DDS according to claim 5, wherein said filter is a low pass filter.

7. The DDS according to claim 6, wherein said low pass filter is an anti-alias low pass filter.

8. The DDS according to claim 1, wherein said waveform output is a periodic waveform.

9. The DDS according to claim 1, wherein said waveform output is a sinusoidal waveform.

10. A method for a direct digital synthesizer (DDS) to generate a waveform output, comprising steps of:

(a) defining plural difference weighted coefficients;

(b) providing a frequency input and a clock signal;

(c) generating a digital thermometer code in response to said frequency input and said clock signal;

(d) generating an analog waveform in response to said digital thermometer code and said plural difference weighted coefficients; and (e) filtering said analog waveform for obtaining a desired waveform output.

* * * * *